US006876219B2

(12) United States Patent
Vollrath

(10) Patent No.: US 6,876,219 B2
(45) Date of Patent: Apr. 5, 2005

(54) TEST CONFIGURATION WITH AUTOMATIC TEST MACHINE AND INTEGRATED CIRCUIT AND METHOD FOR DETERMINING THE TIME BEHAVIOR OF AN INTEGRATED CIRCUIT

(75) Inventor: Jörg Vollrath, Olching (DE)

(73) Assignee: Infineon Technologies AG, Munich (DE)

( * ) Notice: Subject to any disclaimer, the term of this patent is extended or adjusted under 35 U.S.C. 154(b) by 107 days.

(21) Appl. No.: 10/429,578

(22) Filed: May 5, 2003

(65) Prior Publication Data

US 2003/0221149 A1 Nov. 27, 2003

(30) Foreign Application Priority Data

May 3, 2002 (DE) .......................... 102 19 916

(51) Int. Cl.[7] .................................................. G01R 31/06
(52) U.S. Cl. ..................... 324/765; 324/158.1
(58) Field of Search ............................... 324/763–765, 324/158.1, 73.1, 102; 714/718–719, 700, 724; 365/201; 368/118, 113

(56) References Cited

U.S. PATENT DOCUMENTS 3,585,500 A * 6/1971 Grubel ........................ 324/102
5,301,156 A * 4/1994 Talley ......................... 365/201
6,658,611 B1 * 12/2003 Jun ............................. 714/719

FOREIGN PATENT DOCUMENTS

DE 100 45 671 A1 3/2002

OTHER PUBLICATIONS

Daehn, W.: "Demodulation Based Testing of Off–Chip Driver Performance", European Test Workshop, Informal Digest, May 29–Jun. 1, 2001, IEEE, 2002, pp. 42–47.

* cited by examiner

Primary Examiner—Vinh P. Nguyen
(74) Attorney, Agent, or Firm—Laurence A. Greenberg; Werner H. Stemer; Ralph E. Locher

(57) ABSTRACT

A test system and a method for testing an integrated circuit determines the synchronization of the integrated circuit by a current measurement rather than conventionally in the time domain. The present principle is based on the insight that the current consumption of a DUT given simultaneous driving of data on a common data channel from the DUT and from the tester is dependent on a superposition of both signals. Accordingly, highly accurate conclusions about the phase angle of the two signals with respect to one another can be drawn from the present current consumption. The principle presented can be applied particularly to DDR-SDRAMs with a low outlay.

9 Claims, 6 Drawing Sheets

TEST CONFIGURATION WITH AUTOMATIC TEST MACHINE AND INTEGRATED CIRCUIT AND METHOD FOR DETERMINING THE TIME BEHAVIOR OF AN INTEGRATED CIRCUIT

BACKGROUND OF THE INVENTION

Field of the Invention

The present invention relates to a test configuration with an automatic test machine and an integrated circuit and to a method for determining the time behavior of an integrated circuit.

In integrated circuits, in particular in semiconductor memories, it is normally desirable to be able to detect the time behavior thereof exactly. In particular, the precise instant of data outputting or the time behavior of the data output window is of great interest in the case of high-speed memory chips. This is the case with single data rate (SDR) and with double data rate (DDR) synchronous dynamic random access memories (SDRAMs).

Normally, speed tests are carried out for high-performance memory chips during the manufacture thereof in order to determine the data output time window and, if appropriate, to segregate by sorting the memory modules which do not fulfil defined specifications.

During a read access, an SDRAM outputs data that are synchronized with respect to an external clock signal. In this case, the relative phase angle of the data signal output with respect to the predetermined clock signal lies in the range of a few nanoseconds or even in the range of picoseconds. The outlay for measuring whether or not a specific memory chip fulfils predetermined specifications, and the associated costs, increase ever further as the speed of the accesses increases and the data transfer rates rise.

The paper titled "Demodulation Based Testing of Off-Chip Driver Performance", by W. Daehn, European Test Workshop, Informal Digest 2001, pages 93 to 98, specifies a method for testing the performance of the output drivers of integrated circuits. In this case, periodic signals are used which are analyzed in the frequency domain rather than in the time domain. Complicated analyses in the time domain can thus be simplified. However, in order to move from an analysis in the time domain to an analysis in the frequency domain, comparatively complicated signal processing is necessary. At the time of the patent application, this document was retrievable on the Internet for example under http://www.computer.org.digital library ETW01.

Published, Non-Prosecuted German Patent Application DE 100 45 671 A1 specifies a test apparatus and a test method for an integrated semiconductor circuit in which a circuit to be tested is driven by a test pattern generator. A measuring device is used to detect the waveform of the transient power supply current of the circuit to be tested. The waveform of the power supply current is evaluated by an error detector.

SUMMARY OF THE INVENTION

It is accordingly an object of the invention to provide a test configuration with an automatic test machine and an integrated circuit and a method for determining the time behavior of the integrated circuit which overcome the above-mentioned disadvantages of the prior art devices and methods of this general type, in which the time behavior is detected at data outputs with a significantly reduced outlay, in particular in the case of high-speed memory chips.

With the foregoing and other objects in view there is provided, in accordance with the invention, a test configuration. The test configuration contains an automatic test machine having at least one data terminal for providing a first data signal, a current supply terminal and a control output. An integrated circuit is connected to and is tested for electrical properties by the automatic test machine. The integrated circuit has a circuit data terminal connected to the data terminal, a circuit current supply terminal connected to the current supply terminal, and a control input connected to the control output. The integrated circuit provides a second data signal at the circuit data terminal in a manner dependent on a signal present at the control input. A measurement device is connected to the current supply terminal of the automatic test machine. The measurement device detects current consumption of the integrated circuit. The current consumption results from a superposition of the first and second data signals. An evaluation unit is connected to the measurement device and assigns to a value of the current consumption a further value representing a measure of synchronization of the integrated circuit.

The time behavior of the integrated circuit is to be understood as the synchronization thereof with a reference quantity that can be fed externally. The time behavior of the integrated circuit is preferably to be understood as the lead-in/follow-up of data outputting during read accesses to the integrated circuit.

In accordance with the present principle, contrary to the procedure customary to those skilled in the art, data are simultaneously output on a data channel between the integrated circuit and the automatic test machine from the two units involved. It is usually the case, by contrast, that, depending on whether a read access from or a write access to the integrated circuit is involved, data are transferred alternately in the two possible directions.

Furthermore, the present principle is based on the insight that the current consumption of the integrated circuit is dependent on the present superposition of the data signal output by the integrated circuit itself and the data signal output by the automatic test machine. This principle can be explained in a greatly simplified manner such that, if the data signal currently has a logic high level, output by the automatic test machine, the current consumption of the integrated circuit in order likewise to produce a high level on the data channel is very much lower than pulling the channel to a different level.

The current consumption of the integrated circuit is accordingly proportional to the overlap of the first and second data signals or is at least dependent thereon. Consequently, with knowledge of the current consumption, the sought time behavior of the integrated circuit can be deduced.

The present principle can be advantageously employed particularly when a separate current supply terminal is provided at the integrated circuit for the output driver (off-chip driver). In this case, the output driver is connected to the data terminal of the integrated circuit.

On account of the fact that the current measurement constitutes an averaged measurement, jitter that possibly occurs in the tester is likewise averaged. The known complicated measurement of whether or not an integrated circuit complies with specific specification limit values, for example, is accordingly replaced by a limited number of current measurements which can be carried out with a low outlay. In this case, it is possible, in a simple manner, to extrapolate the measurement results with regard to the so-called pass-fail border, i.e. the threshold of whether or not a specific integrated circuit complies with predetermined limit values.

On account of the high outlay for measuring high-speed random access semiconductor memories in the case of measurement in the time domain, the method described can be applied in particular to DDR-SDRAMs.

If the data channel provided between the data terminals of the integrated circuit and the automatic test machine has an impedance, for example a characteristic impedance, then the current consumption of the integrated circuit is dependent both on the impedance and on the respective driver capability of the automatic test machine and of the integrated circuit.

The data terminals of automatic test machine and integrated circuit are preferably configured as tristate outputs.

In order to enable the overlap of the data signals and thus the time behavior of the integrated circuit to be deduced from the current consumption in a simple manner, the first and second data signals are preferably formed as square-wave signals.

However, depending on the intended application, it lies within the scope of the invention also to use differently coded signals.

The first and second data signals preferably have the same frequency. However, the data signals may also have different frequencies.

All the components required in accordance with the present principle are normally present anyway in a conventional test environment for testing integrated circuits, so that the outlay for the measurement set up in accordance with the present principle is extremely low.

With the foregoing and other objects in view there is provided, in accordance with the invention, a method for determining a time behavior of an integrated circuit. The method includes connecting the integrated circuit to an automatic test machine for bi-directional data transfer, for current supply, and for driving the integrated circuit. A first data signal from the automatic test machine to the integrated circuit and of a second data signal from the integrated circuit to the automatic test machine are simultaneously transferred. A current consumption of the integrated circuit is detected during the data transfer. A value representing a synchronization of the integrated circuit is output in a manner dependent on the current consumption thereof.

The method according to the invention is also based on the principle that the first and second data signals are simultaneously output by the integrated circuit and the automatic test machine. In this case, the respective terminals of integrated circuit and automatic test machine at which the first and second data signals are output are connected to one another. The current consumption of the integrated circuit, which is measured during this data transfer, again depends on the overlap of the first and second data signals. Consequently, for example using previously stored tables or using calculations, it is possible without difficulty to infer the phase difference and thus the time behavior of the integrated circuit relative to a reference value. If the current consumption of the integrated circuit is compared with predeterminable limit values, then it is possible, without difficulty, to decide whether or not the integrated circuit currently being tested complies with applicable limit values and hence fulfils specifications.

In order to be able to deduce the time behavior of the integrated circuit from the present current consumption thereof, it may be expedient or desirable to carry out a calibration and/or an error estimation of this measurement method. In this case, it is possible to determine, by way of example, suitable values of the signal frequency of the data signals, which may also be predetermined, however, of the pulse width or the duty ratio of the data signals used, of the voltage levels for high and low states of the data signals, the value of the supply voltage, etc.

Equally, it may be expedient to determine beforehand, by use of a measurement, the driver capability of the integrated circuit at the data terminal and/or the driver capability of the automatic test machine at the data terminal.

Other features which are considered as characteristic for the invention are set forth in the appended claims.

Although the invention is illustrated and described herein as embodied in a test configuration with an automatic test machine and an integrated circuit and a method for determining the time behavior of the integrated circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
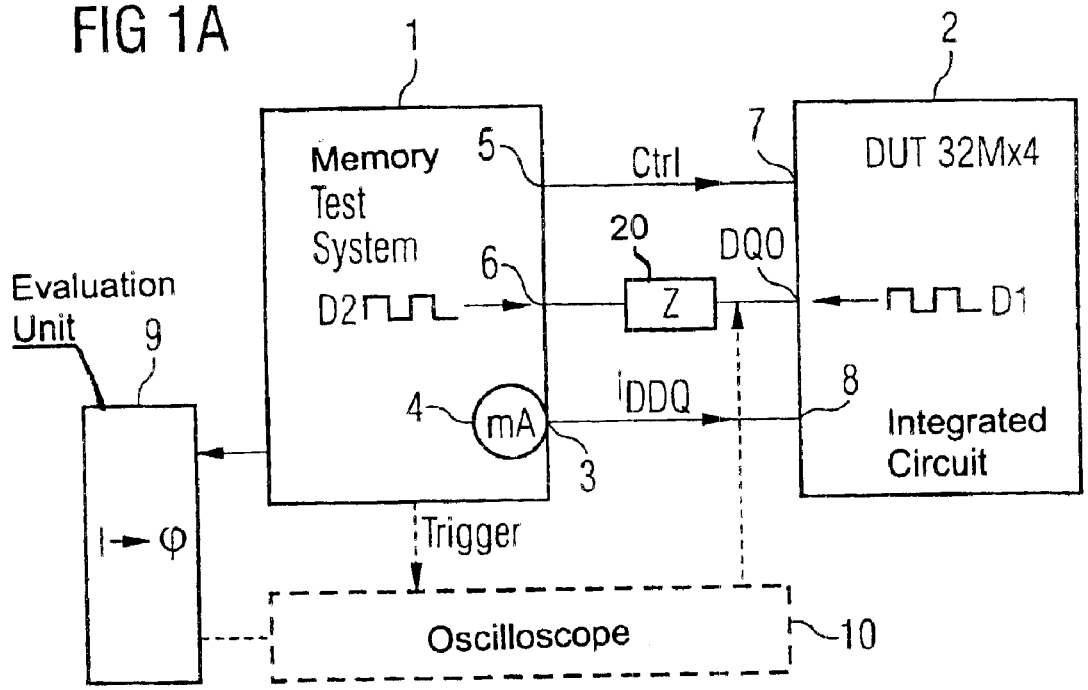
FIG. 1A is a block circuit diagram of an experimental setup with a test configuration containing an automatic test machine and an integrated circuit according to the invention.

Referring now to the figures of the drawing in detail and first, particularly, to FIG. 1A thereof, there is shown a test configuration with an automatic test machine 1 and an integrated circuit 2, which is configured as a 128M×4 or 32M×4 SDRAM in the present case. The integrated circuit 2 is connected to the automatic test machine 1 and is designated here as a device under test (DUT). The automatic test machine 1 has a current supply terminal 3, to which is connected a current measurement device 4 provided internally in the automatic test machine 1, and furthermore a control output 5 for controlling a connected DUT and at least one data terminal 6. The data terminal 6 is configured for the connection of a bidirectional read/write terminal (DQ0) of the semiconductor memory 2. The integrated circuit 2 contains a control input 7, a data terminal DQ0, which is connected to an internal output driver (off-chip driver, OCD), and a current supply terminal 8, which is configured as a separate current supply terminal for the output driver which drives the output terminal DQ0 of the integrated circuit 2.

The control output 5 of the automatic test machine 1 is connected to the control input 7 of the integrated circuit 2. Furthermore, the data terminal 6 of the automatic test machine is connected to the data terminal DQ0 of the semiconductor memory via a bi-directional data channel 20. The data channel 20 has an electrical characteristic impedance Z of 50 ohms. Moreover, the current supply terminal 3 of the automatic test machine 1 is connected to the current supply terminal 8 of the integrated circuit 2. An evaluation unit 9 is connected to the automatic test machine 1 in order to evaluate the current consumption detected by the measurement device 4. The evaluation unit 9 assigns to the present value of the current $I_{DDQ}$ a value $\phi$ that describes the time behavior of the integrated circuit 2, namely a phase angle $\phi$ of the first data signal relative to the second data signal. In this case, the first data signal D2 is output by the tester 1 at the terminal 6, while the second data signal D1 is simultaneously output by the DUT 2 at the data terminal DQ0.

In order to verify the measurement results provided by the evaluation unit, for example in a calibration step for calibrating the test configuration described, an oscilloscope 10 is connected both to the automatic test machine 1 and to the data channel with the characteristic impedance Z. By use of the oscilloscope 10 it is possible to detect the actual phase angle $\phi$ in the time domain directly on the data channel. However, the oscilloscope 10 is not necessary in the normal test operation.

Figure 1B:
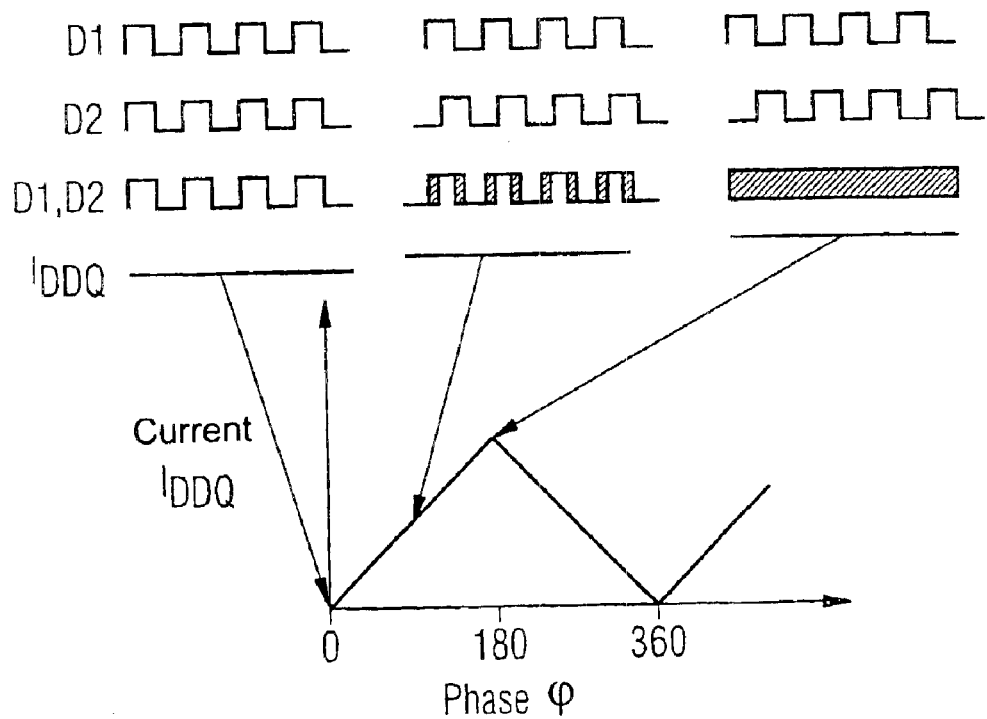
FIG. 1B is a graph showing a greatly simplified illustration, by way of example, of the relationship between first and second data signals, a phase angle thereof and a resulting current consumption.

FIG. 1B describes exemplary data signals suitable for the testing and also the assignment according to the invention between the phase angle $\phi$ and the current consumption $I_{DDQ}$ Of the OCD. In this case, in four rows one below the other, the illustration depicts signal profiles for the first data signal D2, the second data signal D1, the superposition of the data signals D1, D2 and the magnitude of the current $I_{DDQ}$ consumed by the DUT 2 for three cases selected by way of example.

In the left-hand column, the first and second data signals D2, D1 are in phase. The integrated circuit 2 therefore requires only a very low current $I_{DDQ}$.

In the other extreme case, shown on the far right in the illustration of FIG. 1B, namely in the case of a phase shift of $\phi$=180° between the first and second data signals D2, D1, a maximum current $I_{DDQ}$ will flow between terminals 3 and 8, which current is limited only by the driver capability of the tester 1 and of the DUT 2 and by the characteristic impedance Z.

In the intermediate range, illustrated by way of example in the middle column, the measured current consumption is proportional to the overlap of the signals D1 and D2. The lower half of the illustration of FIG. 1B plots the phase angle $\phi$—respectively assigned to the three cases—of the signals D1 and D2 with respect to one another and the measurable current consumption $I_{DDQ}$ resulting in dependence thereon.

FIGS. 1A, 1B also make clear the advantages of the principle according to the invention, according to which a complicated measurement of time parameters in the time domain can be replaced by a current measurement with a low outlay.

Figure 2:
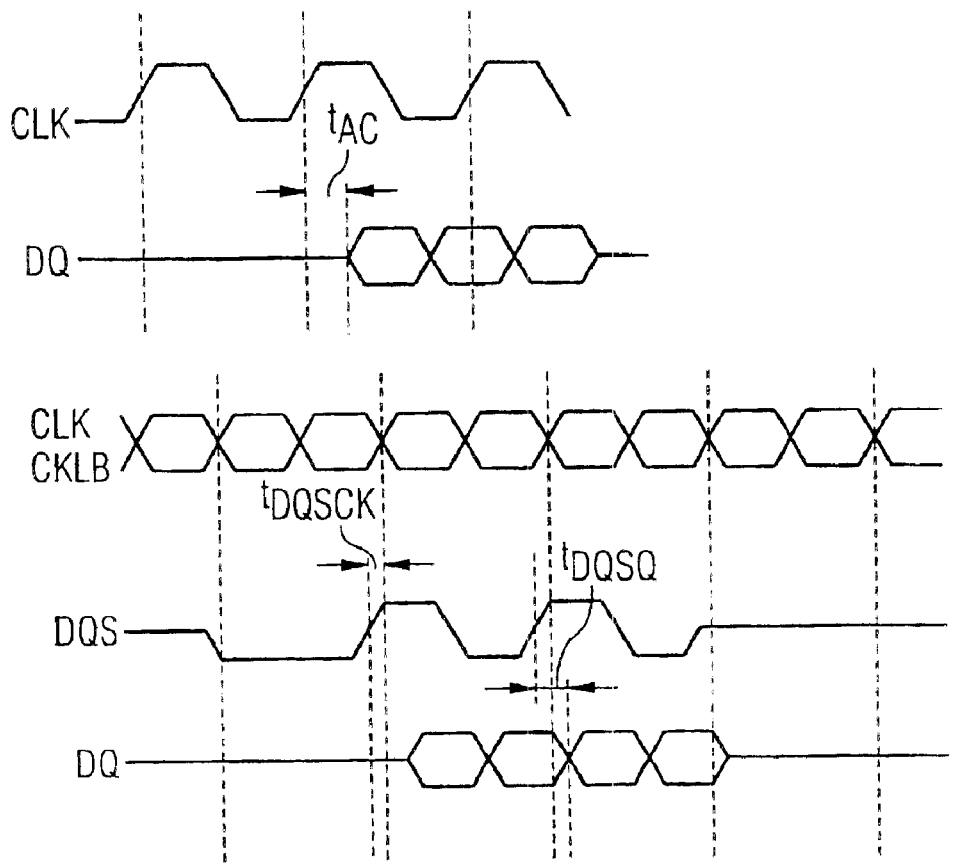
FIG. 2 is a timing diagram showing timing parameters during a read access to an SDRAM and a DDR-SDRAM using selected signal profiles.

FIG. 2 elucidates the background and at the same time an area of application for the underlying problem and the solution thereof. The upper half of FIG. 2 shows, for a conventional SDRAM, the profile of the clock signal CLK and the profile of a DQ signal during a read access. For an SDRAM in the present case, the delay time $t_{AC}$ is usually specified as 5.4 ns, while the time $t_{OH}$ is 3 ns. The lower half of FIG. 2 specifies the conditions for a DDR-SDRAM; here the specified time parameter values for DQ and DQS signals lie in the range of from 500 to 750 picoseconds. The illustration makes it clear that the measurement of such short times in the time domain is associated with a high outlay, so that the advantages of the present principle, namely the current measurement that is possible with a low outlay, become evident in a significant manner.

Figure 3:
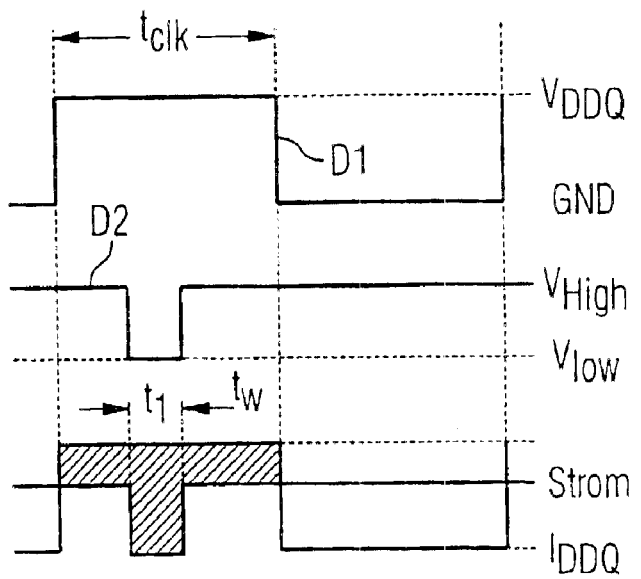
FIG. 3 is a timing diagram showing a derivation of a mathematical relationship between current consumption and signal profiles of the data signals.

A mathematical derivation of the relationship between the magnitude of the current $I_{DDQ}$ and the signal profiles of the data signals D1, D2 will be specified with reference to FIG. 3, which describes the time profiles of selected signals using a diagram. In this case, the signal profile of the data signal D1 provided by the DUT is shown, which signal generates a logic one followed by a logic zero. The profile of an exemplary data signal D2 provided by the automatic test machine is depicted underneath. The data signal D1 may assume values between the supply voltage provided by the tester at the input 8, namely $V_{DDQ}$, and reference-ground potential GND. The data signal D2 varies between a high level and a low level, $V_{High}$, $V_{Low}$, provided by the automatic test machine 1. The current $I_{DDQ}$ depicted underneath, which can be measured by the measurement device 4, is merely that current which is required by the DUT to drive its data output DQ0. The current depends on the time profiles of the signals D1 and D2 and will be explained in more detail later with reference to FIG. 4. Also depicted in the diagram of FIG. 3 is the clock time $t_{CLK}$, which represents a clock cycle in which data are output by the DUT, the clock cycle starting at 0 ns and lasting until the instant $t_{CLK}$. $t_I$ describes the instant at which a pulse provided by the automatic test machine begins. The pulse width of this pulse is represented by $t_w$.

A discrimination between cases is made for the calculation of the current $I_{DDQ}$:

First case, $0<t_I<t_{clk}$, $t_I+t_w<t_{clk}$, $t_w>0$:

$$I_{DDQMax}=((V_{DDQ}-V_{High})(t_{Clk}-t_w)/t_{clk}+(V_{DDQ}-V_{LOW})t_w/t_{clk})R$$

Second case, $0<t_I<t_{clk}$, $t_I+t_w>t_{clk}$, $t_w>0$:

$$I=((V_{DDQ}-V_{High})t_I/t_{clk}+(V_{DDQ}-V_{LOW})(t_{clk}-t_I)/t_{clk})/R$$

Third case: $2t_{clk}>t_I>t_{clk}$, $t_I+t_w<2t_{clk}$, $t_w>0$:

$$I_{DDQMin}=(V_{DDQ}-V_{High})/R$$

Fourth case: $2t_{clk}>t_I>t_{clk}$, $t_I+t_w>2t_{clk}$, $t_w>0$:

$$I=((V_{DDQ}-V_{High})+(V_{DDQ}-V_{LOW})(t_I+t_w-2t_{clk})/t_{clk})/R$$

Here, R represents the resistance of the line.

In the first case $t_I<t_{clk}$ and given a fixed pulse width $t_w$, a high constant consumption current $I_{DDQMax}$ is measured independently of $t_I$. If, as in the second case, the term $t_I+t_w$ exceeds the value $t_{clk}$, the current decreases toward a smaller value I. In the third case, the current remains constant at a minimum value $I_{DDQMin}$ until, see case 4, the rising edge of the test signal D2 meets the rising edge of the signal D1.

Figure 4:
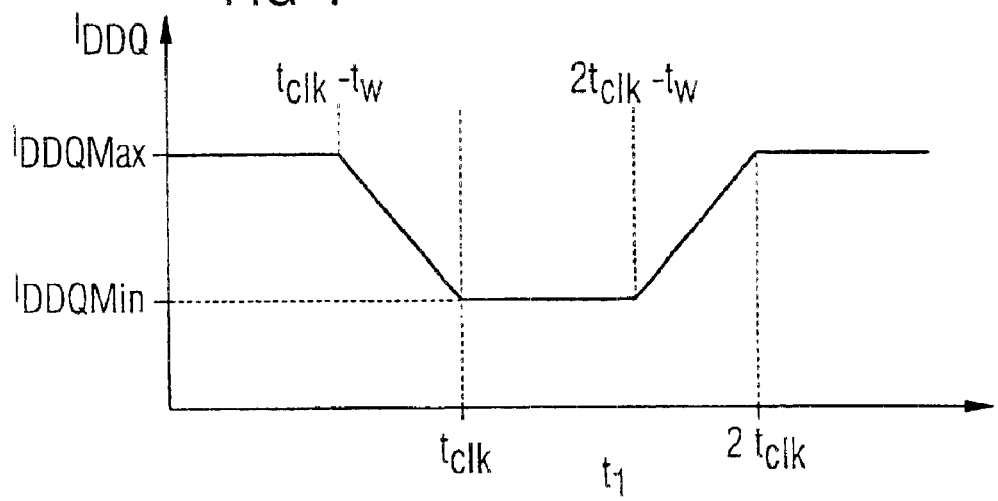
FIG. 4 is a graph showing a state-dependent current consumption of the DUT.

The result of this discrimination between cases is illustrated in FIG. 4. The symbols used have already been explained.

Figure 5:
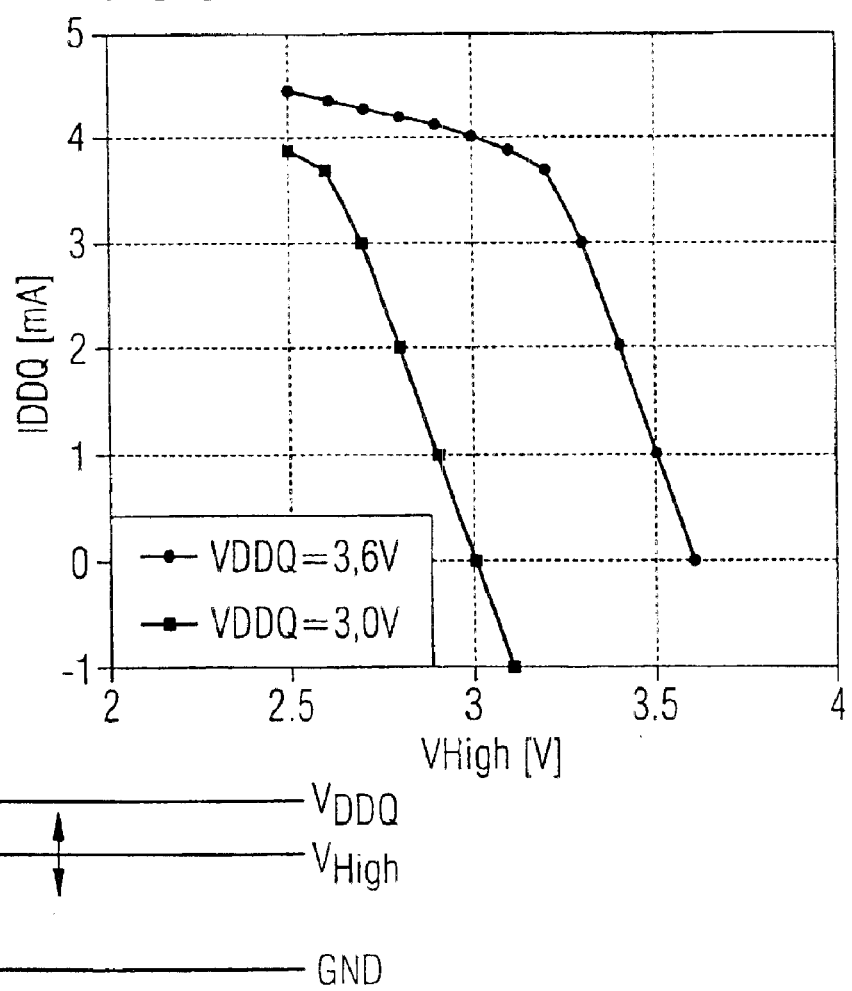
FIG. 5 is a graph showing a driver capability of the integrated circuit as a function of the voltage level provided by the automatic test machine.

FIG. 5 uses a graph to show the measurement of the driver capability of the DUT using the example of a 128M×4 SDRAM in a TSOP 66 package. In this case, the measurement was carried out using an experimental set-up containing the oscilloscope 10, as illustrated in FIG. 1A. A logic high level was output at the data output DQ0 of the DUT. The high level of the automatic test machine at the output 6 thereof was varied between 2.5V and 3.5V. The current consumption $I_{DDQ}$ in mA was measured at the input 8 of the DUT 2. Two curves are specified: first at a supply voltage $V_{DDQ}$ of 3.6V and secondly at a voltage $V_{DDQ}$ of 3.0V. It is evident that, up to a current of 3.5 mA, there is a linear behavior of the output driver of 1 mA per 100 mV voltage difference. The limit of the driver capability is then reached and only a small current change is observed for even higher voltages. The current range must accordingly be limited to values below 4 mA by using for example a small pulse width $t_w$ of the data signal D2 provided by the automatic test machine.

Figure 6:
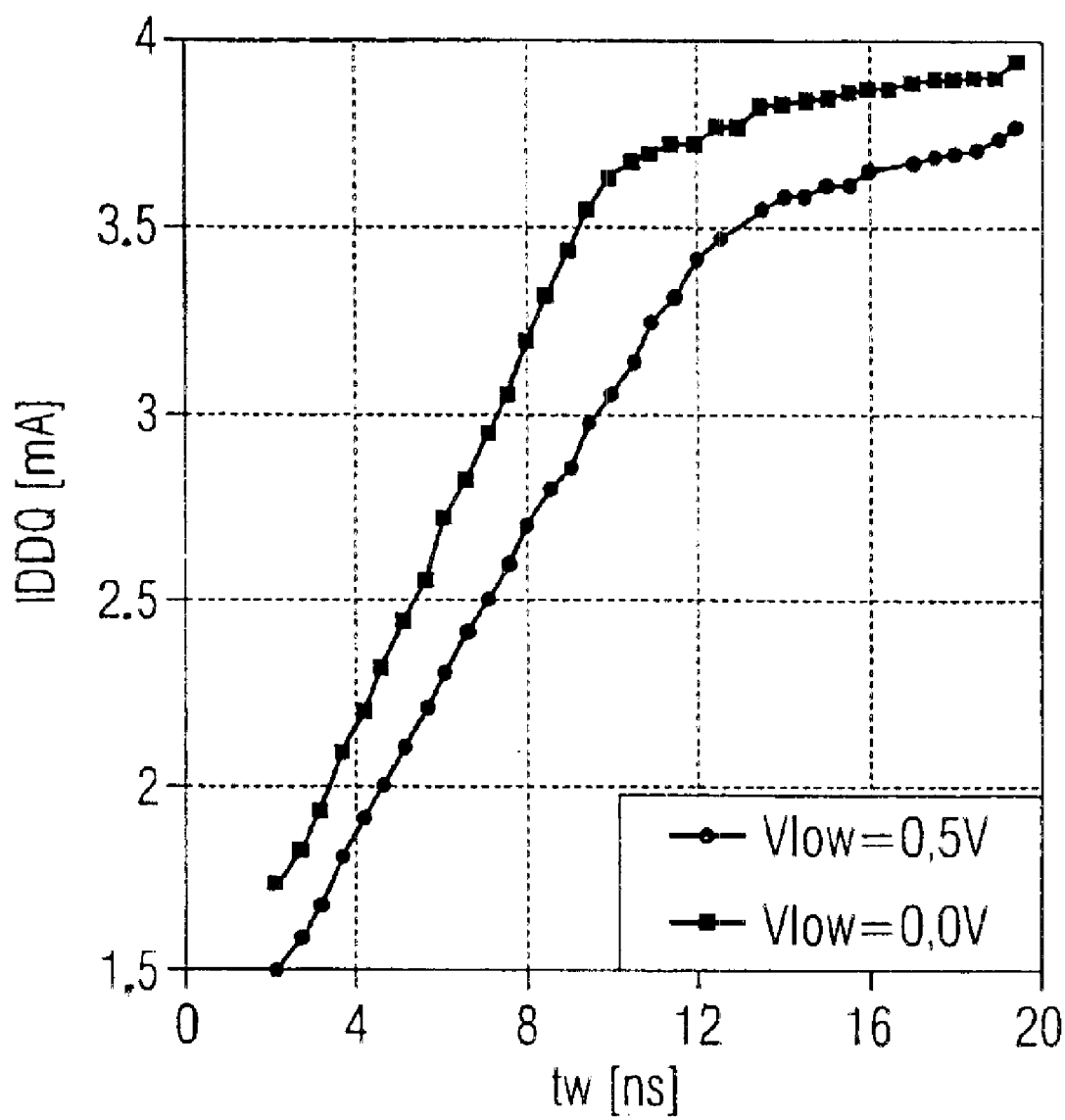
FIG. 6 is a graph showing the driver capability of the integrated circuit as a function of the pulse width.
Figure 6:
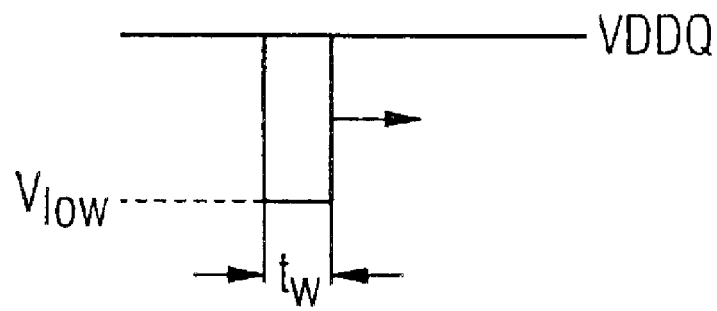

FIG. 6, likewise using a graph, shows the driver capability of the DUT as a function of the pulse width $t_w$ of the data signal D2 provided by the tester. In this case, the level of the signal D2 before and after the low pulse is at a high potential of 3 V. The examination was carried out for a low pulse level of 0 V and 0.5 V as set parameter. A high level of 3 V was provided at the output DQ0 of the DUT. It is evident that a limitation of the driver capability again occurs above 3.5 mA. Since the signal waveform of the tester pulse is not ideal, an extrapolated pulse width of 0 ns still results in a current of 1.1 mA. The gradient of the current curve is greater in the case of a low level of 0.0 V than in the case of a low level of 0.5 V. The extrapolated curves would intersect the time axis at −5 ns.

Figure 7:
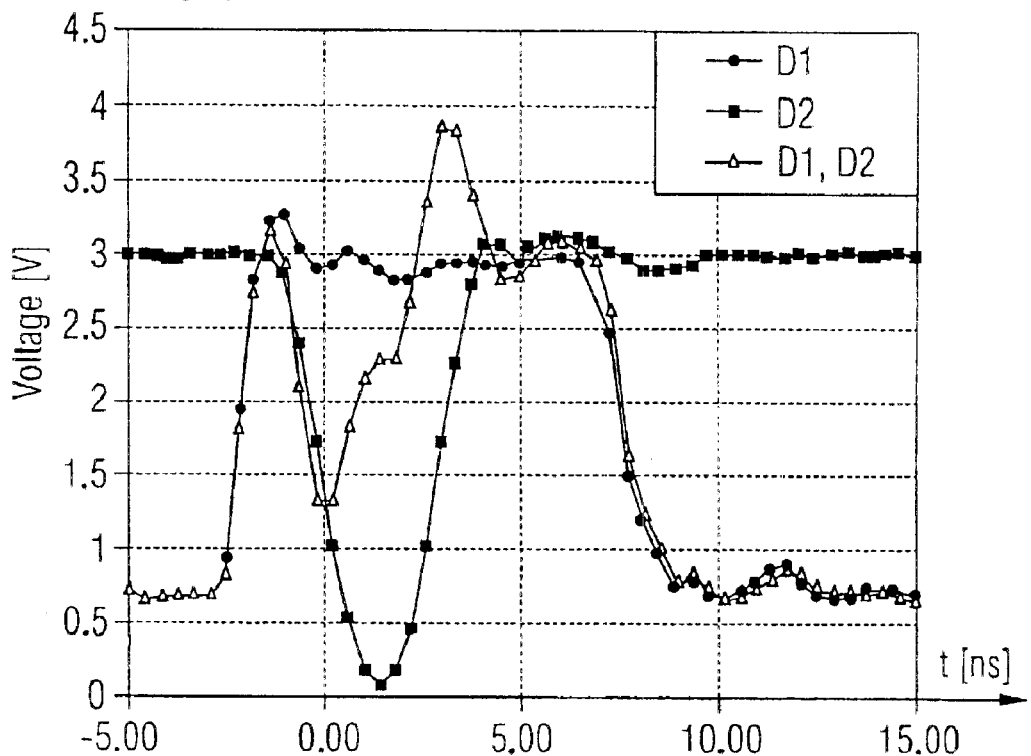
FIG. 7 is a graph showing the combination of the first and second data signals using an exemplary time profile.

FIG. 7 uses a graph to show the measurement of the time behavior of the integrated circuit 2. A data sequence 101010 . . . was chosen in this case. FIG. 7 shows three signals, namely the signal profile D1 of the signal provided by the integrated circuit 2 alone, the signal profile of the data signal D2 provided by the automatic test machine 1 alone, and the superposition of the two data signals D1, D2 on the DQ channel. In the superposition of the two signals, overshoots and undershoots can be observed during the changeover between the logic states. A clock cycle $t_{CLK}$ of 10 ns and a pulse width $t_w$ of 3 ns were used with logic levels of 3 V and 0 V. Since an electrical load was connected to the DQ0 terminal, the logic low level of the DUT only reaches 0.7 V, and not 0 V. Given these parameter settings, the measurement of the timing was carried out in the manner described below.

Figure 8:
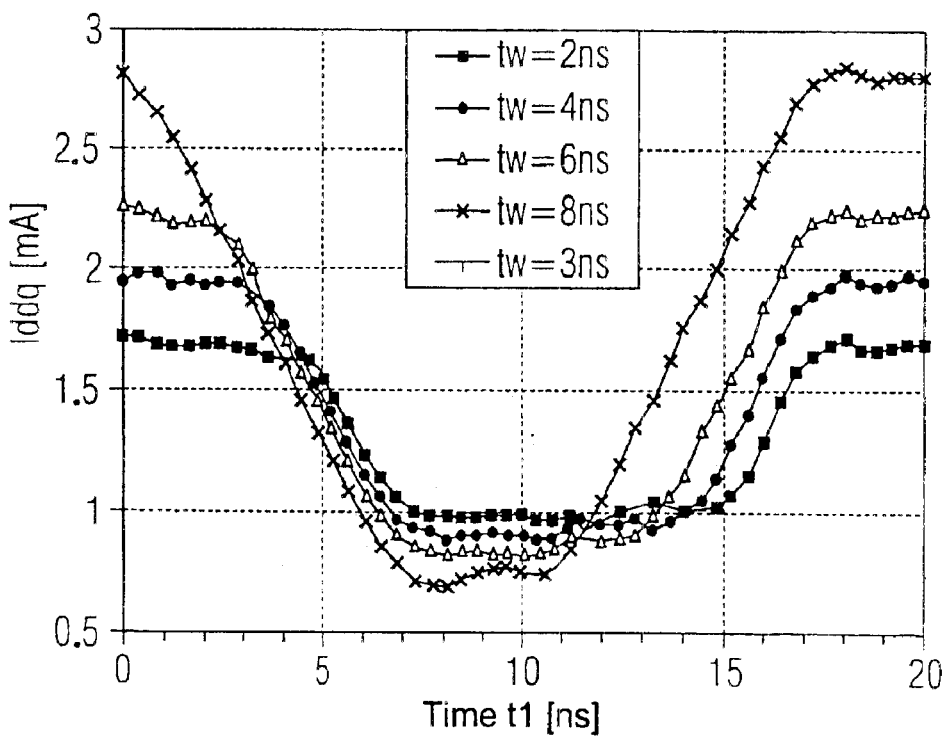
FIG. 8 is a graph showing a dynamic current measurement in accordance with the present principle using an exemplary graph.

FIG. 8 shows the result of the measurement of the time behavior. The instant $t_l$, namely a start time of the pulse provided by the automatic test machine, was varied from 0 ns to 20 ns. The pulse width $t_w$, likewise specified in ns, was used as set parameter. The current consumption $I_{DDQ}$ of the DUT in mA was measured as a function of these two variables. All the measured values were below 3.5 mA in order to avoid saturation effects. The shift in the minimum current level for different pulse widths is surprising. However, it can be explained by including FIG. 6, according to which a pulse width of 0 ns does not result in a current of 0 mA. A slight shift in the falling edge of the current is observed with a different pulse width. The resulting start time $t_l$ for the falling edge is identical for all the pulse widths $t_w$ since the minimum current level is different. In order to extract the start time $t_l$ for the falling pulse edge, the point of intersection between the decreasing current and the minimum current level is determined. At least three points are required for the estimation of the gradient. The gradient of the curves lies between 0.3 mA/ns and 0.35 mA/ns. The minimum current can thus be estimated with an error tolerance of +/−0.05 mA. The instant $t_l$ can therefore be determined with an accuracy of 0.05 mA:0.3 mA/ns, that is to say an accuracy of 170 picoseconds. The instant of the rising edge is estimated on the basis of the point at which the minimum current increases with addition of the pulse width $t_w$ used.

Figure 9:
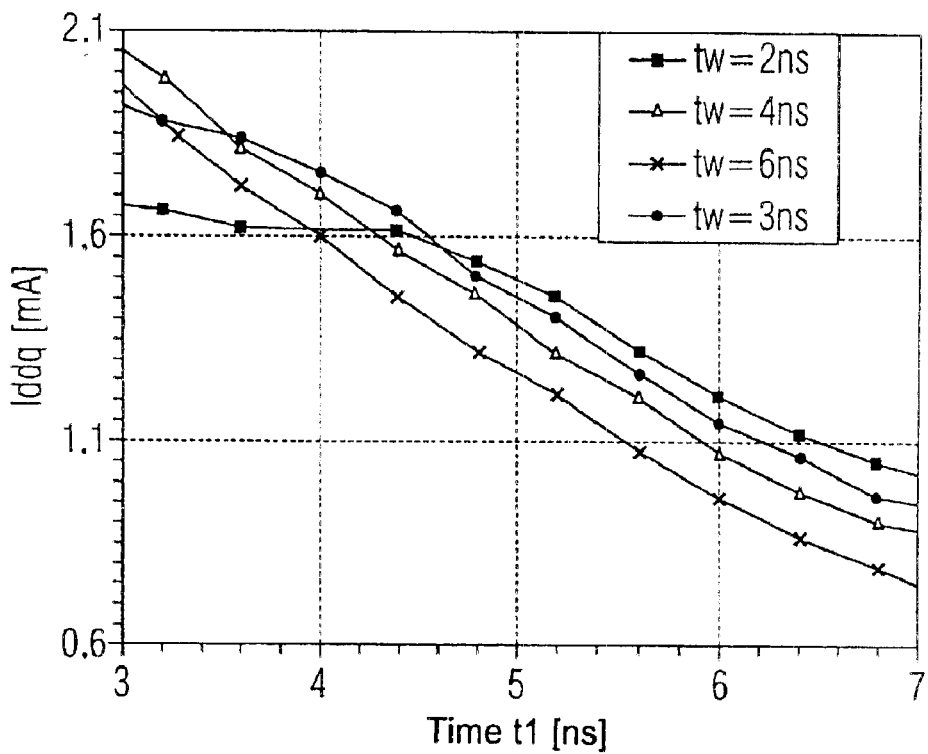
FIG. 9 is a graph showing, by way of example, the relationship between the time behavior and the current consumption of the integrated circuit.
Figure 10:
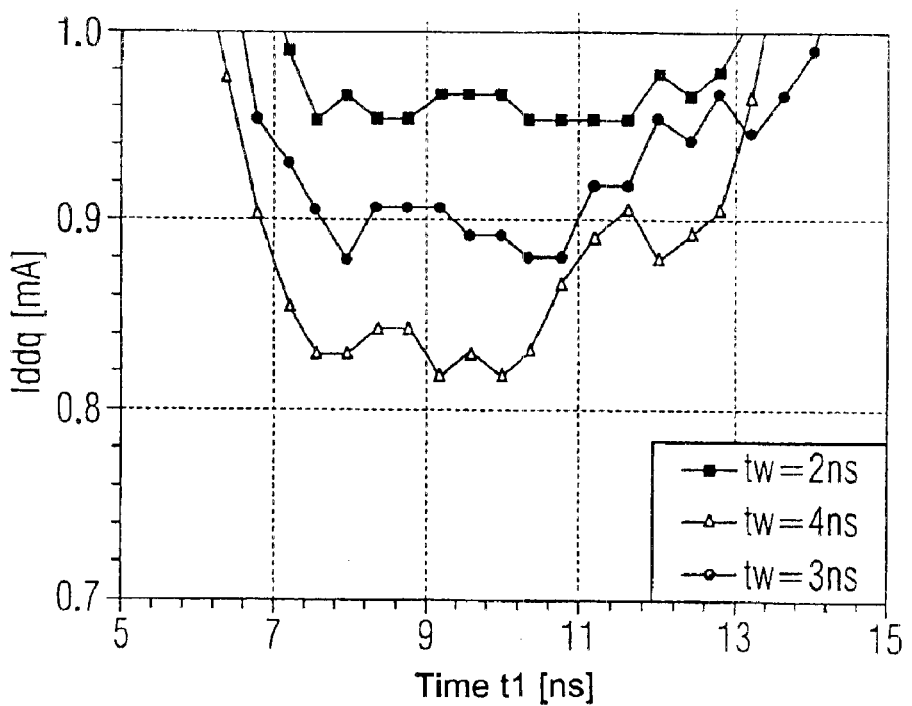
FIG. 10 is a graph showing, by way of example, the relationship between current consumption and time behavior of the integrated circuit.

FIGS. 9 and 10 use further graphs with a higher resolution of the time axis once again with the set parameter pulse width $t_w$ to show the relationship between the current consumption $I_{DDQ^-}$ in mA and the start instant $t_l$, which represents the time behavior of the OUT.

In contrast to a time-based method, the present current-based measurement method averages out the jitter of the automatic test machine and outputs average values for the time behavior. The accuracy of the present measurement principle and the accuracy of the conventional time-based measurement method are approximately identical. The results yield different information, however. Whereas the current measurement yields an average value which is limited by the accuracy of the current measurement, the so-called strobe method yields a pass/fail value which is limited by a jitter of the data output and of the automatic test machine.

I claim:

1. A test configuration, comprising:
   an automatic test machine having at least one data terminal for providing a first data signal, a current supply terminal and a control output;
   an integrated circuit connected to and being tested for electrical properties by said automatic test machine, said integrated circuit having a circuit data terminal connected to said data terminal, a circuit current supply terminal connected to said current supply terminal, and a control input connected to said control output, said integrated circuit providing a second data signal at said circuit data terminal in a manner dependent on a signal present at said control input;
   a measurement device connected to said current supply terminal of said automatic test machine, said measurement device detecting current consumption of said integrated circuit, the current consumption resulting from superposition of the first and second data signals; and
   an evaluation unit connected to said measurement device and assigning to a value of the current consumption a further value representing a measure of synchronization of said integrated circuit.

2. The test configuration according to claim 1, further comprising a data channel connected between said circuit data terminal and said data terminal, said data channel simultaneously driving the first and second data signals into said data channel proceeding from said data terminal and said circuit data terminal.

3. The test configuration according to claim 1, wherein the further value describes a time behavior of said integrated circuit and represents a phase difference between the first and second data signals.

4. The test configuration according to claim 1, wherein the first and second data signals are in each case a square-wave signal.

5. The test configuration according to claim 1, wherein said integrated circuit is a semiconductor memory.

6. A method for determining a time behavior of an integrated circuit, which comprises the steps of:
- connecting the integrated circuit to an automatic test machine for bidirectional data transfer, for current supply, and for driving the integrated circuit;
- simultaneously transferring a first data signal from the automatic test machine to the integrated circuit and of a second data signal from the integrated circuit to the automatic test machine;
- detecting a current consumption of the integrated circuit during the data transfer; and
- outputting a value representing a synchronization of the integrated circuit in a manner dependent on the current consumption thereof.

7. The method according to claim 6, which further comprises forming the value to represent a time behavior of the integrated circuit being a phase difference between the first and second data signals.

8. The method according to claim 6, which further comprises:
- forming the value to represent a time behavior of the integrated circuit; and
- comparing the value with predeterminable limit values for ascertaining if the integrated circuit complies with predeterminable limit values.

9. The method according to claim 6, which further comprises:
- forming the value to represent the current consumption of the integrated circuit; and
- comparing the value with predeterminable limit values for ascertaining if the integrated circuit complies with predeterminable limit values.

* * * * *